(12) United States Patent
Makiyama et al.

(10) Patent No.: US 7,906,417 B2
(45) Date of Patent: Mar. 15, 2011

(54) COMPOUND SEMICONDUCTOR DEVICE WITH T-SHAPED GATE ELECTRODE AND ITS MANUFACTURE

(75) Inventors: Kozo Makiyama, Kawasaki (JP); Tsuyoshi Takahashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 325 days.

(21) Appl. No.: 12/190,216

(22) Filed: Aug. 12, 2008

(65) Prior Publication Data

US 2009/0085063 A1 Apr. 2, 2009

(30) Foreign Application Priority Data

Sep. 28, 2007 (JP) .................................. 2007-253607

(51) Int. Cl.
*H01L 21/44* (2006.01)

(52) U.S. Cl. ......... 438/570; 438/167; 438/285; 438/590; 257/E21.068; 257/E21.069; 257/E21.186; 257/E21.401

(58) Field of Classification Search .................. 438/167, 438/285, 570, 590; 257/E21.068, E21.069, 257/E21.186, E21.407

See application file for complete search history.

(56) References Cited

U.S. PATENT DOCUMENTS

| 2002/0187623 | A1* | 12/2002 | Oikawa et al. ................ 438/590 |
| 2005/0068211 | A1 | 3/2005 | Arai et al. |
| 2007/0267652 | A1* | 11/2007 | Amasuga et al. ............. 257/147 |
| 2008/0237605 | A1* | 10/2008 | Murata et al. .................. 257/76 |

FOREIGN PATENT DOCUMENTS

| EP | 0601541 A2 | 6/1994 |
| JP | 6-232179 A | 8/1994 |
| WO | 03067764 A1 | 8/2003 |

* cited by examiner

*Primary Examiner* — Long K Tran
(74) *Attorney, Agent, or Firm* — Westerman, Hattori, Daniels & Adrian, LLP

(57) ABSTRACT

A method for manufacturing a compound semiconductor device forms an EB resist layer on first SiN film, performs EB exposure at high dose for recess forming opening and at low dose for eaves removing opening, develops the high dose EB resist pattern to etch the first SiN film, selectively etches the cap layer to form a recess wider than the opening of the first SiN film leaving eaves of SiN, develops the low dose EB resist pattern to form the eaves removing opening, etches the first SiN film to extinguish the eaves, forms second SiN film on the exposed surface, forms a resist pattern having a gate electrode opening on the second SiN film to etch the second SiN film, forms a metal layer to form a gate electrode by lift-off. The SiN film in eaves shape will not be left.

10 Claims, 10 Drawing Sheets

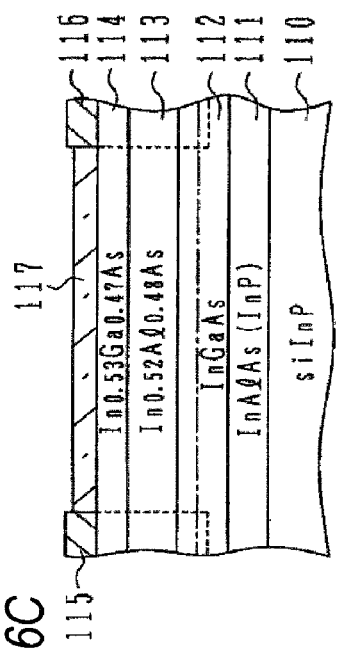
FIG. 6A
PRIOR ART
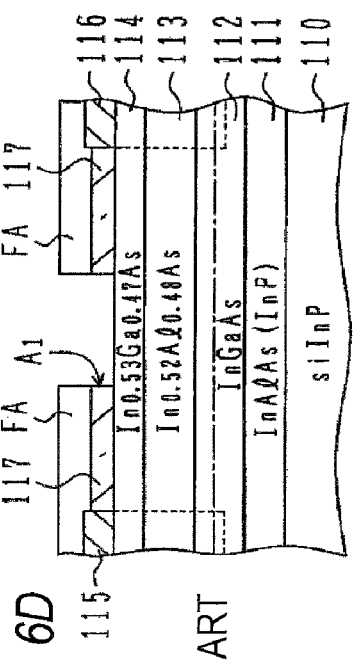
FIG. 6B
PRIOR ART
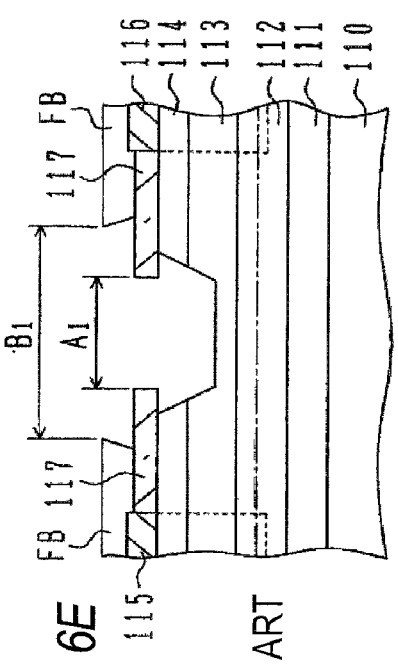
FIG. 6C
PRIOR ART
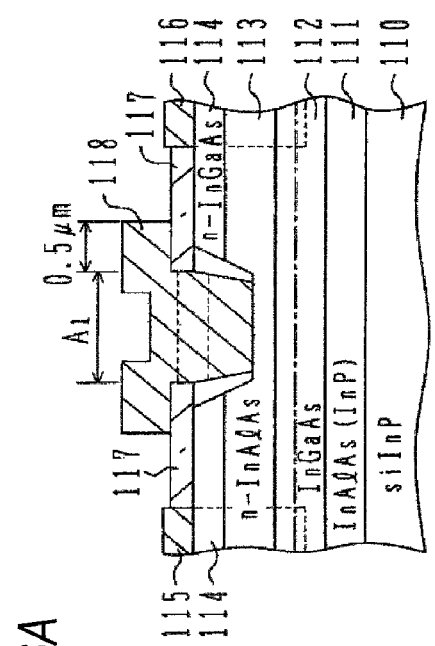
FIG. 6D
PRIOR ART
FIG. 6E
PRIOR ART
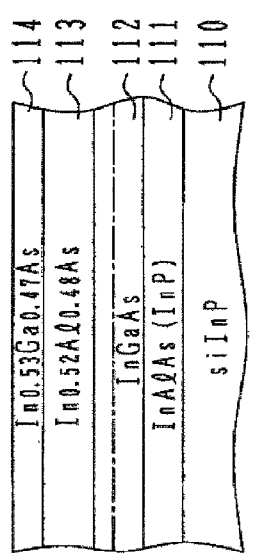

COMPOUND SEMICONDUCTOR DEVICE WITH T-SHAPED GATE ELECTRODE AND ITS MANUFACTURE

CROSS REFERENCE TO RELATED APPLICATION

This application is based on and claims priority of Japanese Patent Application No. 2007-253607 filed on Sep. 28, 2007, the entire contents of which are incorporated herein by reference.

TECHNICAL FIELD

The present invention relates to a compound semiconductor device and its manufacture method.

BACKGROUND

One type of HEMT using an InP substrate adopts the structure that a buffer layer, a channel (electron transit) layer and a carrier (electron) supply layer are subsequently epitaxially grown, thereafter a contact cap layer is grown, the cap layer under the gate electrode is removed, and a T-shaped gate electrode is formed on the carrier supply layer. It is desired to form an insulating film on the surface of a compound semiconductor layer in order to maintain tight adhesion between the surface of the compound semiconductor layer and a resist layer during a wet etching process.

JP-A-HEI-6-232179 discloses the method and structure that an insulating layer is stacked on a cap layer, an opening is formed through the insulating layer, the cap layer is wet etched from the opening, and a gate electrode is formed through the opening. The method and structure will be described with reference to FIGS. 6A to 6E.

The structure shown in FIG. 6A is formed by manufacture processes shown in FIGS. 6B to 6E.

As shown in FIG. 6B, by molecular beam epitaxy (MBE) or organic metal vapor phase epitaxy (OMVPE), a buffer layer 111 of InAlAs lattice matching non-doped InP or InP and having a thickness of about 300 nm is grown on a semi-insulating (si) InP substrate 110, a channel layer 112 of InGaAs having a thickness of about 15 nm is grown on the buffer layer 111, an electron supply layer 113 of $In_{0.52}Al_{0.48}As$ having an electron concentration of $5\times10^{18}$ $cm^3$ and a thickness of 40 nm is grown on the channel layer 112, and a cap layer 114 of $In_{0.53}Ga_{0.47}As$ having an electron concentration of $5\times10^{18}$ $cm^3$ and having a thickness of 10 nm is grown on the electron supply layer 113. The channel layer 112 may be made of InP.

As shown in FIG. 6C, ohmic electrodes 115 and 116 for drain/source regions are formed on the cap layer 114 in predetermined areas by vapor deposition, and high concentration n-type layers are formed under the ohmic electrodes 115 and 116 by an alloying process. Next, an SiN insulating film 117 of about 50 to 100 nm is formed by plasma CVD. Insulating material such as $SiO_2$ and SiON may be used which can be formed at a lower temperature than SiN.

As shown in FIG. 6D, a photoresist film FA having an opening is formed by photolithography, and the insulating film 117 is etched by using the photoresist film FA as an etching mask to form an opening $A_1$. The insulating film 117 formed with the opening $A_1$ is used as a mask when performing recess etching to be described later, and defines a channel length and width of the gate electrode. After the opening $A_1$ is formed, the photoresist film FA is removed.

As shown in FIG. 6E, by photolithography, a photoresist film FB is formed having an opening which is inclusive of the opening $A_1$ and has an area $B_1$ broader than that of the opening $A_1$. After the photoresist film FB is formed, the cap layer 114 is recess-etched by using the insulating film 117 as a mask to form a recess broader than the opening $A_1$ of the insulating film 117 through the cap layer 114. This recess etching may use etchant of phosphoric acid aqueous solution and hydrogen peroxide aqueous solution. A recess structure is formed also in the electron supply layer 113.

Next, Ti/Pt/Au are sequentially formed by vacuum deposition at thicknesses of 50 nm, 50 nm and 500 nm, respectively, and an unnecessary photoresist FB is removed by lift-off to leave a T-shaped gate electrode.

In this manner, the Schottky gate electrode 118 shown in FIG. 6A is formed. A leg portion of the Schottky gate electrode 118 is formed in a rectangular shape along the opening $A_1$ of the insulating film 117, and although the Schottky gate electrode contacts the electron supply layer 113, it does not contact the cap layer 114. The opening $A_1$ is hermetically sealed with the Schottky gate electrode 118, and the inner space formed in the recess structure is completely shut off from an external atmosphere.

According to the structure and manufacture method shown in FIGS. 6A to 6E, the mask used for the recess etching restricts the layout of the gate electrode, and the gate electrode cannot be positioned nearer to the side wall of the cap layer than the opening position of the SiN film. Since the recess structure is symmetrical to the gate electrode, a drain offset structure cannot be realized in which the gate electrode is set nearer to the source electrode and remoter from the drain electrode to lower a source resistance.

International Publication WO 03/067764 proposes to realize the drain offset structure in the following manner. A dummy pattern of phosphosilicate glass (PSG) or the like is formed on a cap layer, an SiN layer is deposited on the dummy pattern, and an opening reaching the cap layer is formed through the SiN film at the position asymmetrical to source/drain regions at which a gate electrode is desired to be formed, to etch and remove the dummy pattern via the opening. The cap layer exposed in the area where the dummy pattern was removed is etched via the opening to realize the drain offset structure.

Similar points to JP-A-HEI-6-232179 are that the SiN film in an eaves shape exists above the cap layer and the gate electrode contacts the SiN film. Although the drain offset structure can be realized, the layout of the gate electrode is restricted by the eaves structure of the SiN film, and a parasitic capacitance exists between the gate electrode and the SiN film in the eaves shape.

The development of compound semiconductor devices using GaN or GaN-containing compound semiconductor is very active. GaN has a high band gap of 3.4 eV, allowing high voltage operations. Since GaN is resistant against high voltage, it is expected to be applied to usage requiring high voltage and high speed operations such as high electron mobility transistors (HEMT) for base stations of mobile phones. There are various reports on GaN-HEMT in which GaN/AlGaN is formed on a substrate of sapphire, SiC, GaN, Si or the like by crystal growth and the GaN layer is used as an electron transit layer. A recent report indicates a breakdown voltage in excess of 300 V in a current-off state. The best output characteristics are obtained by GaN-HEMT using an SiC substrate. A high thermal conductivity of SiC constitutes the best output characteristics. In order to manufacture a high speed operation GaN device, a semi-insulating SiC substrate is used to restrict parasitic capacitance.

SUMMARY

According to one aspect of the present invention, there is provided a compound semiconductor device comprising:

a compound semiconductor substrate;

epitaxially grown layers formed above said compound semiconductor substrate and including a channel layer and a resistance lowering cap layer above said channel layer;

source and drain electrodes in ohmic contact with said channel layer;

recess formed by removing said cap layer between said source and drain electrodes;

a first insulating film formed on upper surface of said cap layer and having side edges at positions retracted from edges, or at same positions as the edges of said cap layer in a direction of departing from said recess;

a second insulating film having gate electrode opening and formed covering a semiconductor surface in said recess and said first insulating film; and a gate electrode formed on said recess via said gate electrode opening.

According to another aspect of the present invention, there is provided a method for manufacturing a compound semiconductor device comprising steps of:

(A) epitaxially growing layers including a channel layer and a resistance lowering cap layer in the order from a lower layer, above a compound semiconductor substrate by MOCVD;

(B) forming source and drain electrodes in ohmic contact with said channel layer;

(C) forming a first insulating film on said cap layer, said first insulating film covering said source and drain electrodes;

(D) forming an electron beam resist layer on said first insulating film and performing electron beam exposure at different doses, at a high dose for a recess forming opening and at a low dose for an eaves portion removing opening;

(E) developing said electron beam resist layer with low solubility developing liquid to form the recess forming opening, and etching said first insulating film;

(F) selectively wet-etching said cap layer by using as a mask said electron beam resist layer formed with said recess forming opening and said first insulating film, to form a recess wider than said recess forming opening and leave eaves portions of said first insulating film protruding over said recess;

(G) developing said electron beam resist layer with high solubility developing liquid to form the eaves portion removing opening, and etching said exposed first insulating film to extinguish the eaves portions of said first insulating film;

(H) forming a second insulating film on an exposed semiconductor surface, said second insulating film covering said first insulating film;

(I) forming a resist pattern having a gate electrode opening on said second insulating film; and (J) forming a gate electrode forming metal layer on said resist pattern to form a gate electrode by lift-off.

BRIEF DESCRIPTION OF THE DRAWINGS

FIGS. 6A to 6E are cross sectional views of a compound semiconductor device and a semiconductor substrate illustrating main processes of its manufacture method, according to prior art.

DESCRIPTION OF THE EMBODIMENTS

Embodiments of the present invention will be described with reference to the accompanying drawings.

Figure 1A:
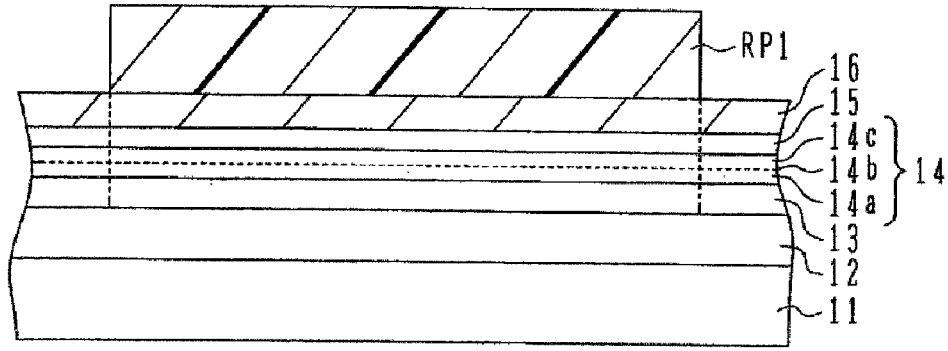
FIGS. 1A to 1P are cross sectional views of a semiconductor substrate illustrating main processes of a method for manufacturing a compound semiconductor device according to a first embodiment of the present invention.
Figure 1B:
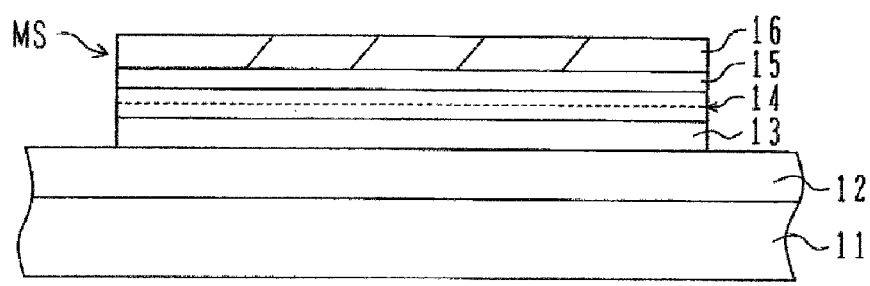
Figure 1C:
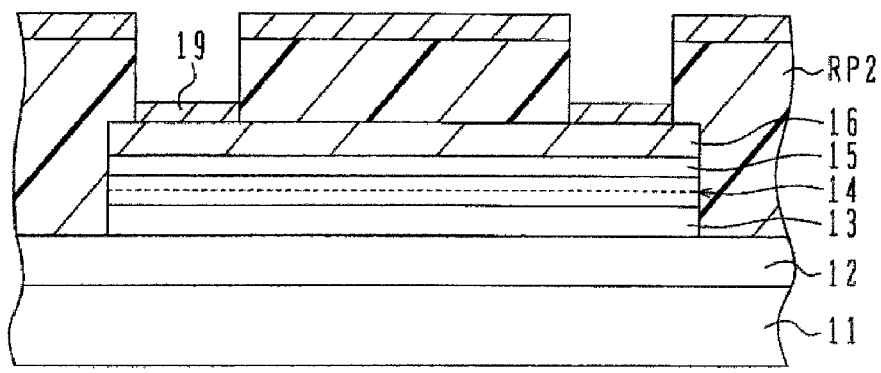
Figure 1D:
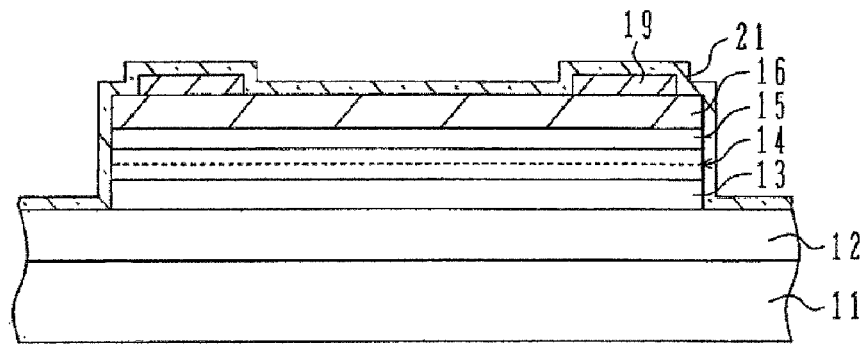
Figure 1E:
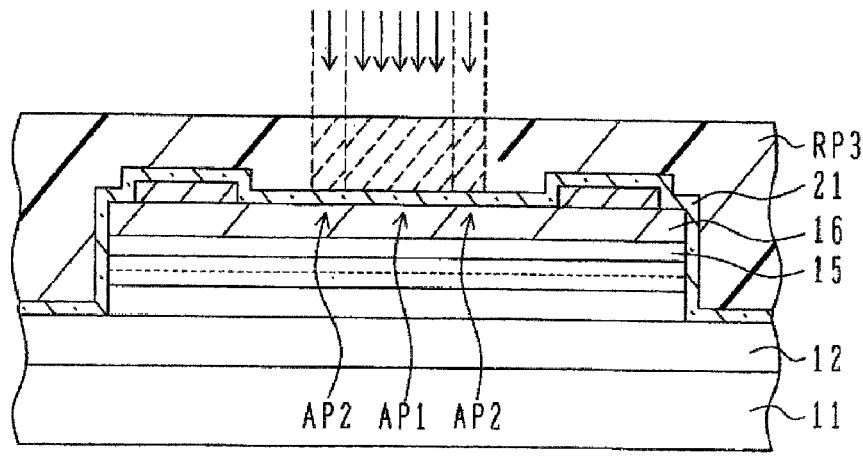
Figure 1F:
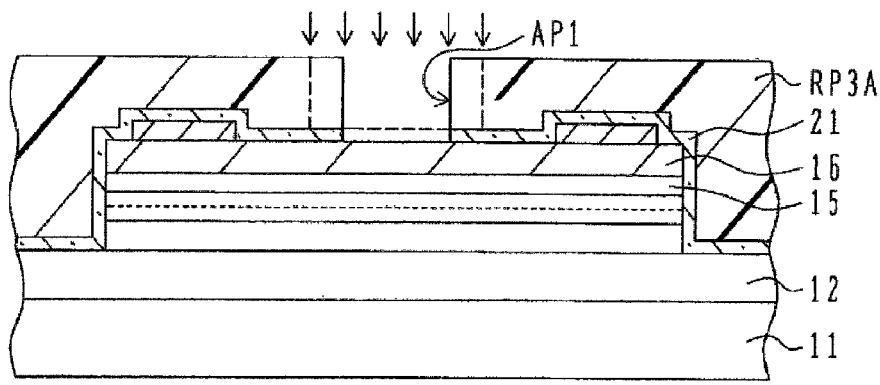
Figure 1G:
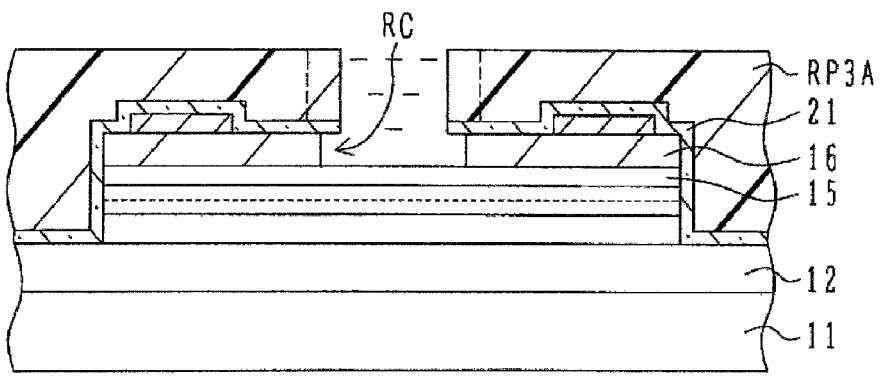
Figure 1H:
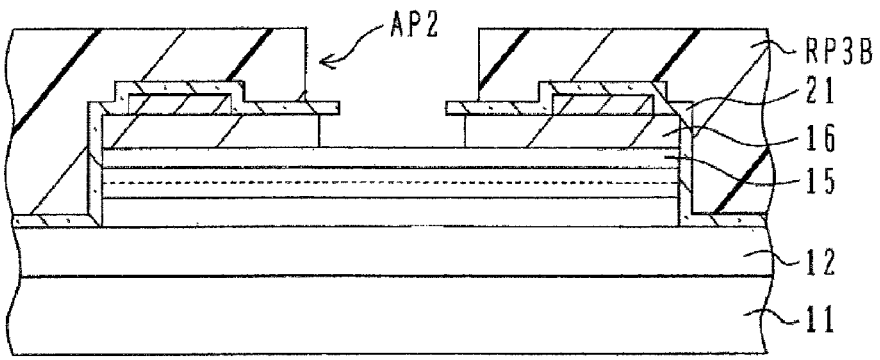
Figure 1I:
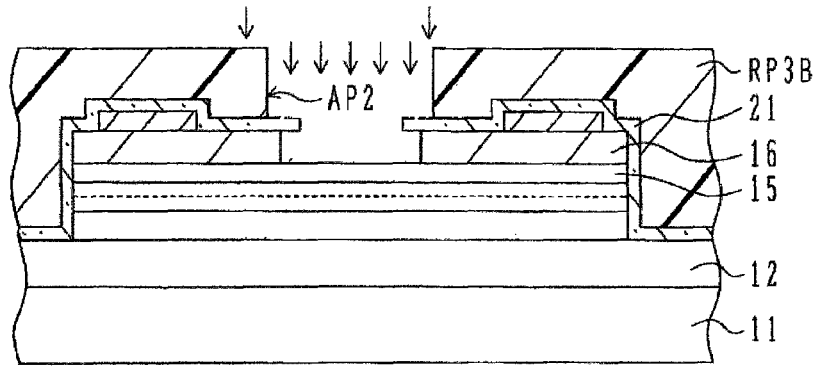
Figure 1J:
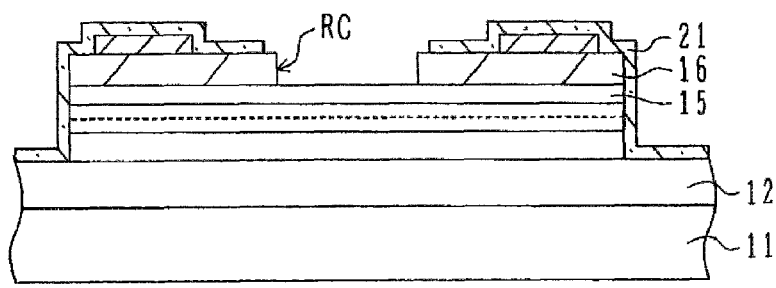
Figure 1K:
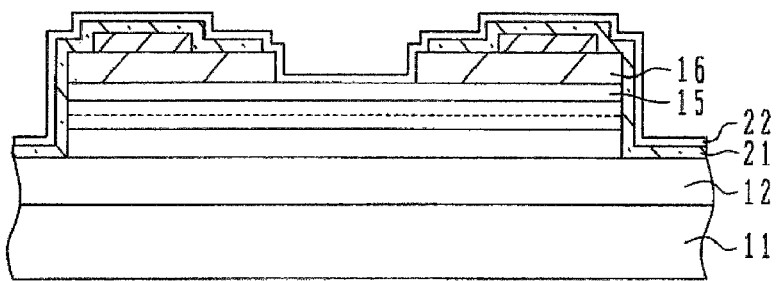
Figure 1L:
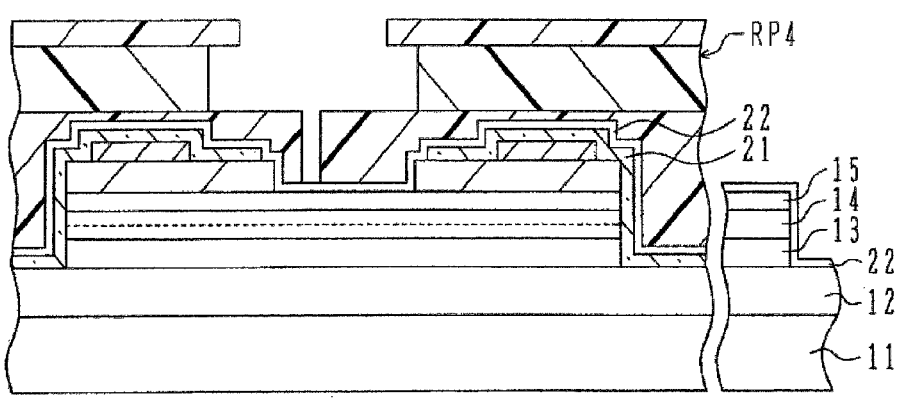
Figure 1M:
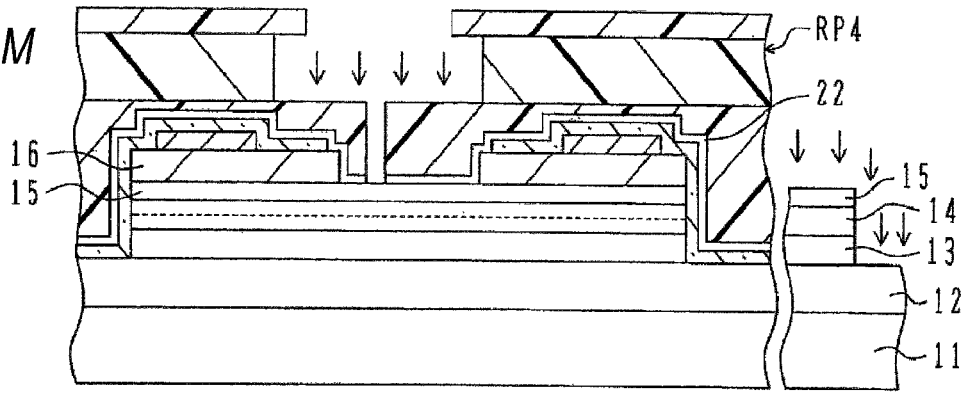
Figure 1N:
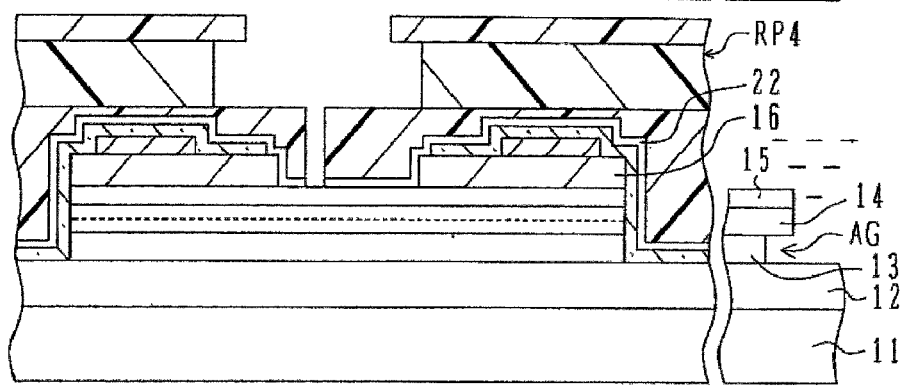
Figure 1O:
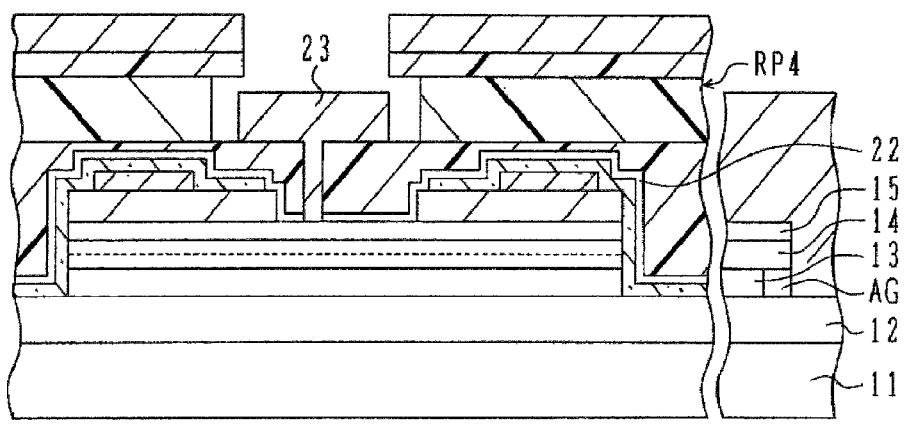
Figure 1P:
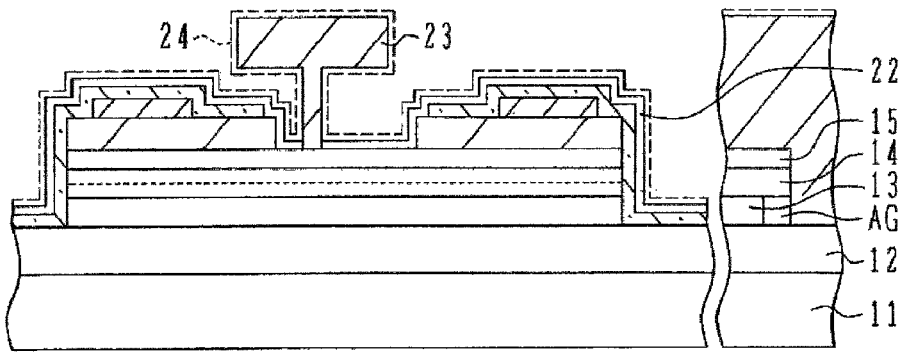

FIGS. 1A to 1P are cross sectional views of a semiconductor substrate illustrating main processes of a method for manufacturing a compound semiconductor device according to the first embodiment, and FIGS. 2A to 2D are plan views showing examples of a plan shape of a resist pattern used by the manufacture processes.

As shown in FIG. 1A, grown on a semi-insulating (si) InP substrate 11 by metal organic chemical vapor deposition (MOCVD) are: an intrinsic (i)—InAlAs buffer layer 12 of 50 nm or thicker; an i-InGaAs channel (electron transit) layer 13 of 5 nm or thicker; an i-InAlAs spacer layer 14a; planar doping 14b at $5\times10^{12}$ cm$^{-2}$; an i-InAlAs barrier layer 14c; an InP etch stopper layer 15 having a thickness of, e.g., 2 nm to 6 nm; and a contact n-InGaAs cap layer 16 having a thickness of, e.g., 50 nm. Although thickness upper limits of the buffer layer 12 and channel layer 13 do not exist specifically, the thickness upper limit may be 3 μm in practical use. The i-InAlAs spacer layer 14a, planer doping 14b at $5\times10^{12}$ cm$^{-2}$, and i-InAlAs barrier layer 14c may be considered collectively as the carrier supply layer 14. A thickness of the carrier supply layer 14 is 5 nm to 30 nm, a thickness of the i-InAlAs spacer layer 14a is, e.g., 3 nm, and a thickness of the i-InAlAs is 6 nm. A thickness of planer doping 14b may be considered to be 0. The carrier supply layer 14 may be structured as a stack of the i-InAlAs spacer layer 14a and n-InAlAs layer 14c. A carrier concentration of the n-InGaAs cap layer 16 is $1\times10^{18}$ cm$^{-3}$ to $1\times10^{20}$ cm$^{-3}$, e.g., $1\times10^{19}$ cm$^{-3}$. The cap layer lowers the contact resistance of source and drain electrodes to be formed thereon (realizing low resistance). The InP etch stopper layer 15 may be omitted.

Source gases used by MOCBD are, for example, trimethylindium (TMIn) for In, trimethylaluminum (TMAl) for Al, triethylgallium (TEGa) for Ga, arsine (AsH$_3$) for As, phosphine (PH$_3$) for P, and silane (SiH$_4$) or disilane (Si$_2$H$_6$) for n-type impurities Si.

A resist pattern RP1 for defining an active region is formed on the n-InGaAs cap layer 16 by photolithography.

Figure 2A:
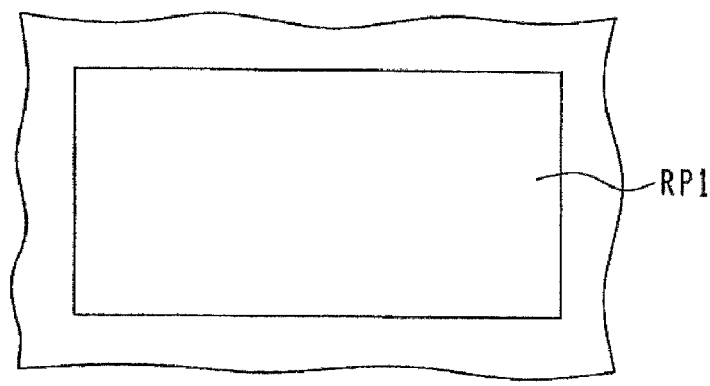
FIGS. 2A to 2D are plan views showing examples of a plan shape of a resist pattern used by the compound semiconductor device manufacture method of the first embodiment.

FIG. 2A is a schematic plan view of a plan shape of the resist pattern RP1. A rectangular resist pattern RP1 defines the active region, and a region exposed in the peripheral area of the resist pattern becomes the isolation region. A size of the active region is 10 μm along a source/drain direction or a right/left direction in the drawing figure, and 50 μm in a gate width direction or a vertical direction in the drawing figure. For the convenience of drawing, the vertical direction has a reduced scale.

Reverting to FIG. 1A, by using the resist pattern RP1 as an etching mask, the epitaxial layers are wet etched down to the channel layer 13 inclusive, by mixture liquid of phosphoric acid and hydrogen peroxide aqueous solution. The resist pattern RP1 is thereafter removed.

As shown in FIG. 1B, the element region mesa MS is therefore formed being constituted of the i-InGaAs channel layer 13, InAlAs carrier supply layer 14, InP etch stopper layer 15 and n-InGaAs cap layer 16.

As shown in FIG. 1C, a resist pattern RP2 is formed on the mesa MS by photolithography, the resist pattern having openings for forming source and drain electrodes.

Figure 2B:
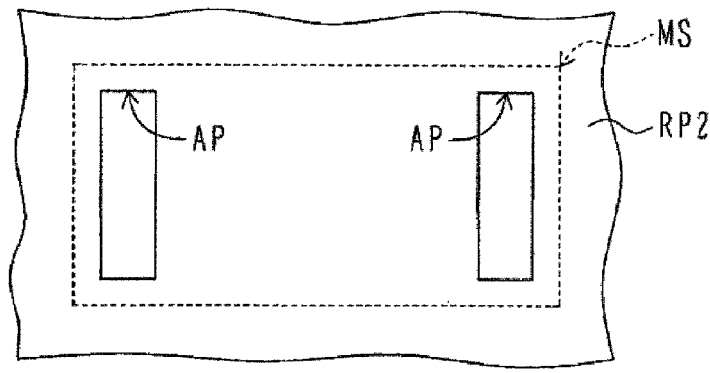

FIG. 2B shows schematically a plan shape of the resist pattern RP2. The resist pattern having two rectangular openings AP is therefore formed on the mesa MS. The openings AP for defining the source/drain electrodes are disposed facing each other at a distance of 2 μm between the source/drain electrodes.

Reverting to FIG. 1C, for example, a Ti layer of 20 nm thick, a Pt layer of 50 nm thick and an Au layer of 200 nm thick are vapor deposited downward on the n-InGaAs cap layer 16, to form ohmic electrodes. The metal layer on the resist pattern RP2 is removed by lift-off together with the resist pattern RP2 to leave the ohmic electrodes 19. Annealing is performed if necessary to establish ohmic characteristics.

As shown in FIG. 1D, a first insulating film 21 is deposited by plasma CVD, covering the mesa MS formed with the ohmic electrodes 19. The first insulating film 21 is, e.g., an SiN film having a thickness of 10 nm to 50 nm, e.g., 20 nm.

As shown in FIG. 1E, an electron beam resist layer is coated on the substrate and drawn at different doses to form a resist pattern RP3. For example, electron beam resist ZEP520-A7 manufactured by Zeon Corporation is spin-coated to a thickness of 300 nm, and baked for 3 minutes at 180°. A recess region opening pattern AP1 is drawn at a high dose, e.g., 250 μC/cm². Extended opening forming patterns AP2 are drawn at a low dose, e.g., 125 μC/cm² on both sides of the pattern AP1 by a width of, e.g., 50 nm. The extended opening forming pattern AP2 is used for removing the eaves portions of the first insulating film formed by recess forming etching.

Figure 2C:
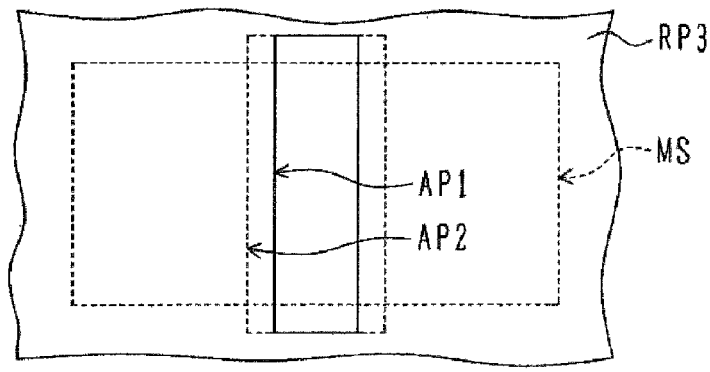

FIG. 2C shows a plan shape of the resist pattern RP3. The high dose recess region opening pattern AP1 traverses the mesa MS and reaches step portions on opposite sides. A shorter side of the pattern AP1 is, e.g., 0.2 μm (200 nm). The low dose extended opening forming patterns AP2 expand the initial opening by 50 nm on both sides thereof.

If the patterns AP1 and AP2 are drawn by the same electron beam drawing process, a precision of 10 nm is obtained by a general EB exposure system. This precision is fairly high as compared to a precision of about 30 nm obtained by using different EB exposure processes and a general EB exposure system. If a high precision EB exposure system is used, a precision of 10 nm is obtained by using different exposure processes.

As shown in FIG. 1F, after the electron beam drawing, first only the high dose drawing region is developed by using low solubility developing liquid (e.g., ZMD-B manufactured by Zeon Corporation), to form a first opening AP1. This resist pattern is called a resist pattern RP3A. The low solubility developing liquid is developing liquid having solubility capable of opening the high dose region and not opening the low dose region.

By using the resist pattern RP3A as an etching mask, the first insulating film 21 exposed in the first opening AP1 is removed by dry etching using etchant of $SF_6$ or $CF_4$. An opening transferring the first opening AP1 is therefore formed.

As shown in FIG. 1G, by using the resist pattern RP3A and etched first insulating film 21 as a mask, the n-InGaAs cap layer 16 is wet etched using mixture liquid of phosphoric acid and hydrogen peroxide aqueous solution. Wet etching using etchant containing citric acid may be additionally used. The InP etch stopper layer 15 functions as an etch stopper. The n-InGaAs cap layer 16 is side etched to form a recess RC wider than the opening of the first insulating film 21. The first insulating film 21 protrudes in the eaves shape from the edges of the n-InGaAs cap layer 16 defining the recess.

As shown in FIG. 1H, a low dose drawing region is developed by using high solubility developing liquid (e.g., ZEP-SD manufactured by Zeon Corporation), to form second openings AP2. This resist pattern is called a resist pattern RP3B. The eaves portion and the portion above the edge of the adjacent cap layer 16, respectively of the first insulating film 21, are therefore exposed. The second opening AP2 has a size extending the opposite sides of the first opening AP1, for example, by 50 nm. The high solubility developing liquid is developing liquid having solubility capable of opening even the low dose region.

As shown in FIG. 1I, by using the resist pattern RP3B as an etching mask, the first insulating film 21 exposed in the second opening AP2 is removed by dry etching using etchant of $SF_6$ or $CF_4$.

FIG. 1J shows the state that the resist pattern RP3B was removed. The recess RC is formed through the cap layer 16, the insulating film 21 exists on the upper surface of the cap layer 16 only at positions retracted from the recess side edges, and the eaves portions are extinguished. Since the eaves portions are extinguished, the gate electrode can be formed at a desired position in the recess.

The semiconductor surface is, however, exposed in the recess. It is preferable to passivate the semiconductor surface with an insulating film. The insulating film increases also tight adhesion of a resist layer.

As shown in FIG. 1K, a second insulating film 22 of a silicon nitride film having a thickness of, e.g., 20 nm is deposited on the whole substrate surface by plasma CVD. The semiconductor surface exposed in the recess is therefore covered with the second insulating film 22.

As shown in FIG. 1L, a three-layer EB resist pattern RP4 for forming the gate electrode is formed. Three resist layers are coated, an opening defining a widened portion of a T-shaped gate electrode is formed through the uppermost layer by EB exposure and development, a wider portion housing space for the T-shaped gate electrode is formed through the middle layer, and a leg portion opening of the T-shaped gate electrode for defining the gate length of the gate electrode is formed through the lowermost layer by EB exposure and development. The gate electrode opening is disposed in such a manner that a distance is set to, e.g., 30 nm between the surface (recess edge) of the second insulating film 22 covering the side wall of the cap layer on the source side and the T-shaped gate electrode narrowed portion (leg portion). This realizes an offset gate electrode layout that the gate electrode is disposed near to the source electrode. The right area of the drawing figure show a mesa edge portion exposed in an opening.

Figure 2D:
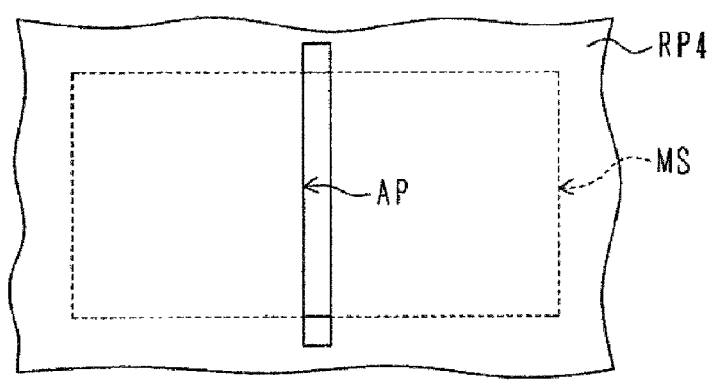

FIG. 2D shows schematically the shape of the leg opening of the T-shaped gate electrode of the resist pattern RP4. The opening traverses the mesa MS. Both the upper surface and side walls of the mesa MS are exposed.

As shown in FIG. 1M, by using the resist pattern RP4 as an etching mask, the second insulating film 22 exposed in the opening is removed by dry etching using $SF_2$ or $CF_4$ as etchant.

As shown in FIG. 1N, mixture liquid of citric acid, hydrogen peroxide aqueous solution and water is permeated via the opening to side-etch the i-InGaAs channel layer 13. The side wall of the i-InGaAs channel layer 13 is retracted from the mesa MS side wall to form an air gap AG.

As shown in FIG. 1O, for example, a Ti layer of 20 nm thick, a Pt layer of 50 nm thick and an Au layer of 200 nm thick are vapor-deposited downward on the substrate, to form a T-shaped gate electrode 23 by lift-off. The leg portion of the T-shaped gate electrode is formed near to the second insulating film on the side wall of the cap layer on the source side at a distance of 30 nm. The upper wider portion lowers electric resistance of the gate electrode.

FIG. 1P shows the state that the resist pattern RP4 was removed. The leg portion of the gate electrode 23 is formed in a region of the recess from which the second insulating film 22 was removed. The gate electrode and channel layer 13 are separated by the air gap AG at the side edge of the mesa.

In the first embodiment, by drawing a plurality type of patterns at different doses on a single electron beam resist layer, a plurality type of etching masks can be formed at a high precision. Although there is a limitation that the second opening of the pattern formed later should be inclusive of the first opening of the pattern formed first, other relative positional relations are set freely. It is possible to freely select a recess shape and the insulating film removed regions on the upper surface of the cap layer on both sides of the recess.

Figure 3A:
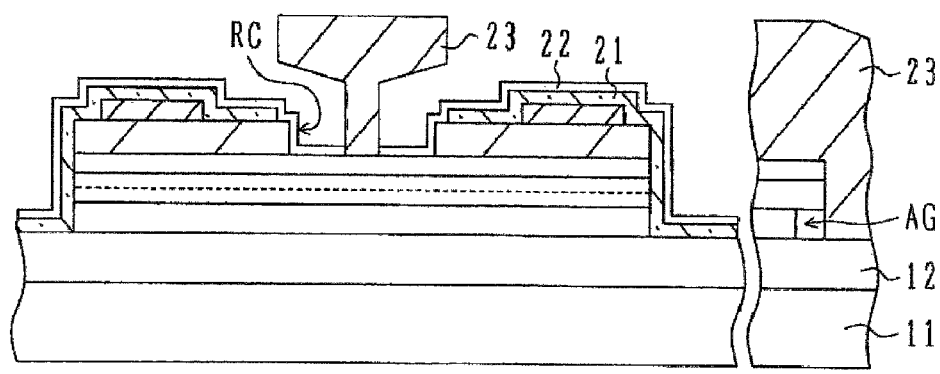
FIGS. 3A to 3D are cross sectional views of a semiconductor substrate showing a modification of the first embodiment.

As shown in FIG. 3A, instead of the offset gate electrode disposed near to the source side, the gate electrode 23 may be disposed in the central area of the recess RC. This can be realized simply by adjusting the position of the gate electrode to be formed in the three-layer electron beam resist layer.

A total thickness increases in the region where the first and second insulating films are grown. A thick insulating film near the gate electrode causes an increase in parasitic capacitance. If sufficient protection effects can be obtained only by the second insulating film 22, the underlying first insulating film may be omitted. As the first insulating film 21 is removed, a distance between the insulating film surface and the gate electrode is widened so that parasitic capacitance can be reduced effectively.

Figure 3B:
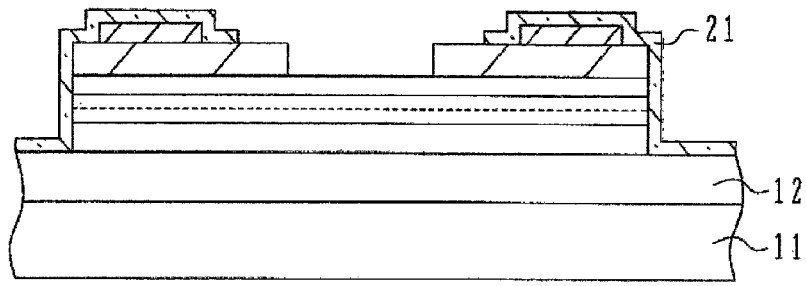

FIG. 3B shows the structure that the first insulating film 21 on both sides of the gate electrode is removed widely. For example, if the source and drain electrodes face at a distance of about 2 μm, the low dose extended opening forming patterns AP2 of the resist pattern RP3 shown in FIG. 1E and 2C are extended to the positions spaced by about 100 nm from the source/drain electrodes 19, and the first insulating film 21 is removed widely in the dry etching process shown in FIG. 1I. The resultant state is shown in FIG. 3B which corresponds to FIG. 1J. Thereafter, in the process shown in FIG. 1K, the second insulating film 22 having a similar thickness to that of the first insulating film is deposited, and then the process shown in FIG. 1L and succeeding processes are performed. As the stack of the first insulating film 21 and second insulating film 22 is reduced or extinguished, parasitic capacitance of the gate electrode lowers and high frequency characteristics can be improved.

Figure 3C:
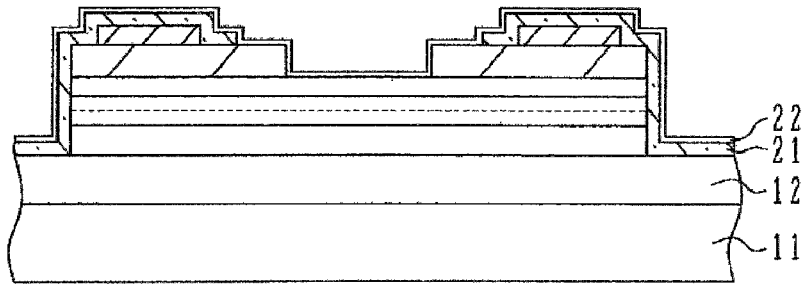

FIG. 3C shows a first modification of the second insulating film. Although it is preferable that the exposed semiconductor surface is covered with the second insulating film to passivate the semiconductor surface and improve tight adhesion to a resist layer, a thickness of the second insulating film 22 is preferably thin for high frequency characteristics. Tradeoff solution is therefore incorporated by forming the second insulating film 22 thinner than the first insulating film. For example, an SiN film of 20 nm thick is used as the first insulating film 21, and an SiN film of 5 nm is used as the second insulating film 22.

Although the passivation function may be sacrificed to some extent depending upon use purposes, tight adhesion to a resist layer is required to be retained in some cases.

Figure 3D:
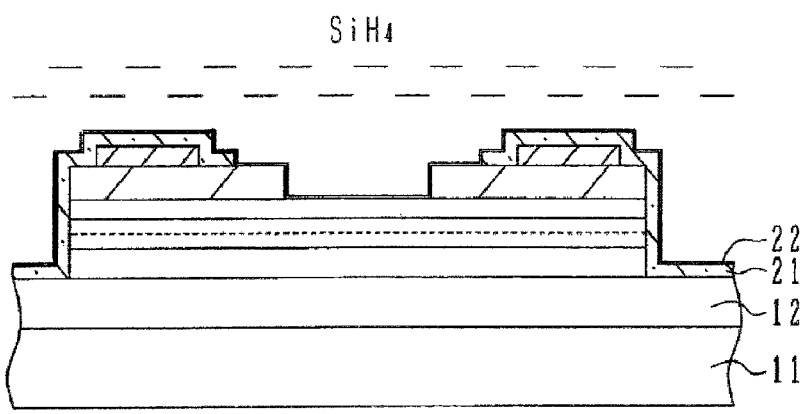

FIG. 3D shows a second modification of the second insulating film. The second insulating film 22 is made of an array layer of Si atoms. For example, the semiconductor surface is exposed to $SiH_4$ plasma at a plasma excitation frequency of 13.56 MHz, a power of 50 W, an $SiH_4$ flow rate of 10 sccm, a pressure of 1000 mtorr, and a substrate temperature of 250° C. An array of Si atoms is therefore formed on the semiconductor surface. This Si atom array layer is used as the second insulating film 22. As Si atoms react with oxygen or the like on the semiconductor surface, an oxide film is formed. A very thin oxide film can be formed, and parasitic capacitance of the gate electrode can be reduced extremely. Instead of silane ($SiH_4$) plasma, disilane ($Si_2H_4$) plasma may possibly be used.

Figure 4A:
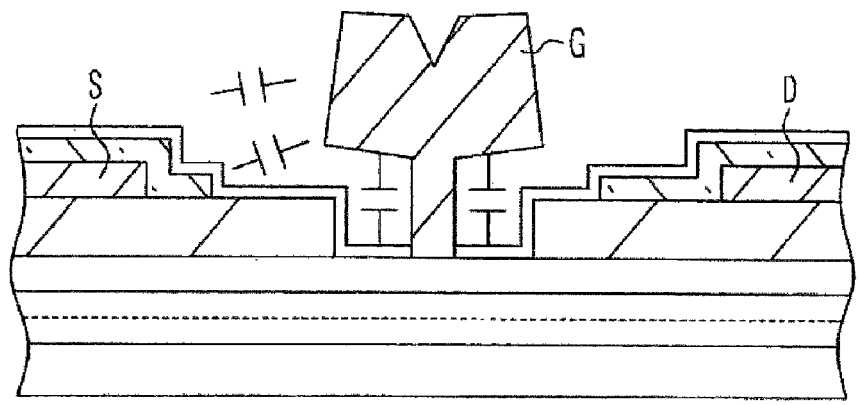
FIG. 4A is a cross sectional view of a semiconductor substrate showing an outline of capacitance distribution near at a gate electrode confirmed by the present inventors.

FIG. 4A is a schematic cross sectional view showing the experimental results of parasitic capacitance of the gate electrode measured by the present inventors. Drain side parasitic capacitance is concentrated on just under the gate electrode, and source side parasitic capacitance distributes in a wide area on the source side. In a high voltage, high frequency HEMT, a large electric field concentration is generated between the drain/gate electrodes. This electric field concentration promotes chemical change.

In these circumstances, it is effective in terms of reliability and high frequency characteristics that the semiconductor surface on the drain side is covered with a relatively thick insulating film.

Figure 4B:
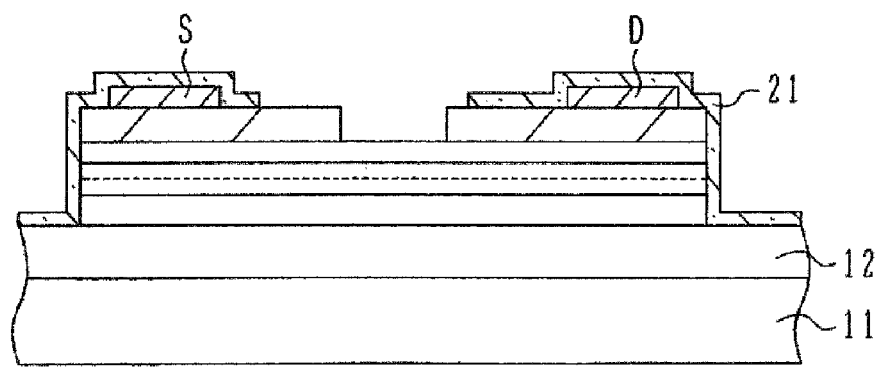
FIG. 4B is a cross sectional view of a semiconductor substrate showing a modification of the first embodiment.

FIG. 4B shows a modification of the first embodiment satisfying these requirements. For example, if the source electrode S and drain electrode D face at a distance of about 2 μm, the low dose extended opening forming pattern AP2 of the resist pattern RP3 is extended on the source side to a position about 100 nm from the source electrode 19, and set to a minimum value on the drain side sufficient for distinguishing the eaves portion. More specifically, since it is not preferable that the eaves portion of the first insulating film 21 is left even partially, the drain side opening AP2 is formed to the position retracted from the edge of the cap layer 16 on the gate electrode side by 10 nm. Since a precision of multiple electron beam drawing is 10 nm, the resultant first insulating film edge is at the position retracted from the edge of the cap layer 16 on the gate electrode side by 0 to 20 nm (not shorter than 20 nm). If a design position is at a position retracted from the edge by 20 nm, the first insulating film is left from a position retracted from the edge of the cap layer 16 on the gate electrode side to a position retracted by 30 nm.

In the dry etching process for the first insulating film 21 shown in FIG. 1I, the first insulating film on the cap layer 16 is removed wider on the source side and narrower on the drain side. A resultant structure is shown in FIG. 4B which corresponds to FIG. 1J. Thereafter, in the process shown in FIG. 1K, the second insulating film 22 having a similar thickness to that of the first insulating film is deposited, and then the process shown in FIG. 1L and succeeding processes are performed. Since the stack of the first insulating film 21 and second insulating film 22 does not exist near the gate electrode on the source side, parasitic capacitance between the gate electrode and source electrode reduces and high frequency characteristics can be improved. The stack of the first insulating film 21 and second insulating film 22 is left on almost the whole surface of the cap layer 16 on the drain side, and high reliability and high breakdown voltage are realized. As described earlier, it is obvious for those skilled in the art that the second insulating film is made thinner than the first insulating film.

Forming the recess in the gate electrode forming region is not limited to HEMT using an InP substrate. Description will now be made on the second embodiment of HEMT using a GaN layer formed on a semi-insulating SiC substrate as an electron transit layer (channel layer).

Figure 5A:
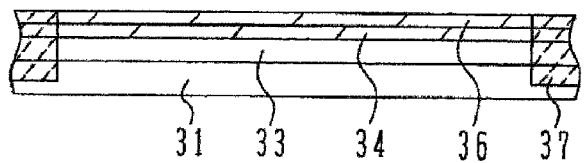
FIGS. 5A to 5K are cross sectional views of a semiconductor substrate illustrating main processes of a method for manufacturing a compound semiconductor device according to a second embodiment of the present invention.

As shown in FIG. 5A, epitaxially grown on a semi-insulating SiC substrate 31 by MOCVD are: a GaN electron transit layer 33; an n-type AlGaN electron supply layer 34; and an n-type GaN cap layer 36. A buffer layer may be formed between the GaN electron transit layer 33 and SiC substrate 31. An isolation region 37 is formed surrounding active regions, by implanting, e.g., Ar ions.

Figure 5B:
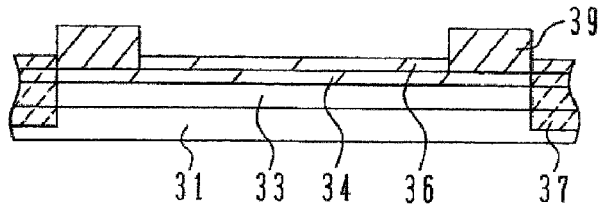

As shown in FIG. 5B, by using a resist mask having openings for source/drain electrode regions, the cap layer 36 is dry etched. For example, a Ti layer of 20 nm thick and an Al layer of 200 nm are formed by vapor deposition or the like to form source/drain electrodes 39 by lift-off. If necessary, heat treatment for alloying is performed.

Figure 5C:
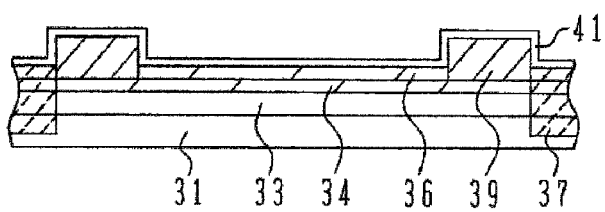

As shown in FIG. 5C, a first insulating film 41 of, e.g., a silicon nitride film having a thickness of, e.g., 20 nm is deposited on the substrate surface by plasma CVD or the like.

Figure 5D:
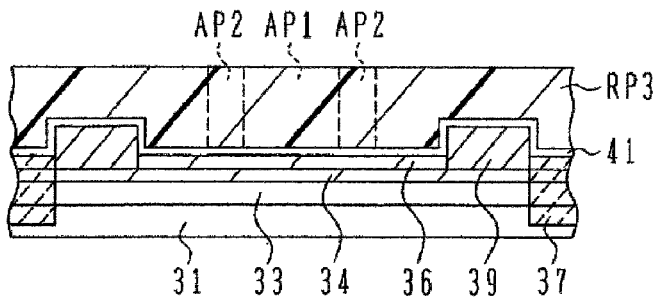

As shown in FIG. 5D, an electron beam resist layer is coated on the first insulating film 41, and drawn at different doses to form a resist pattern RP3. For example, electron beam resist ZEPS20-A7 manufactured by Zeon Corporation is spin-coated to a thickness of 300 nm, and baked for 3 minutes at 180° C. A recess region opening pattern AP1 is drawn at a high dose, e.g., 250 µC/cm². Extended opening forming patterns AP2 are drawn at a low dose, e.g., 125 µC/cm² on both sides of the pattern AP1 by a width of, e.g., 50 nm. The extended opening forming pattern AP2 is used for removing the eaves portions of the first insulating film formed by recess forming etching.

Figure 5E:
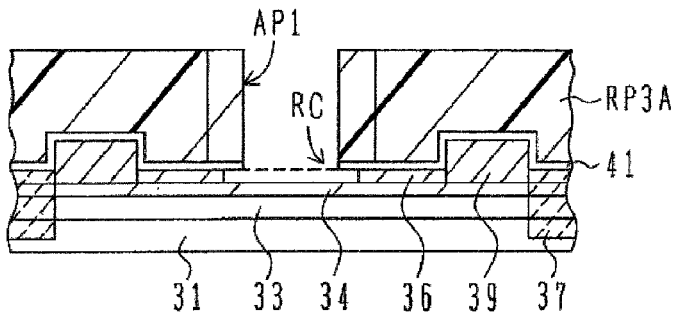

As shown in FIG. 5E, after the electron beam drawing, first only the high dose drawing region is developed by using low solubility developing liquid (e.g., ZMD-B manufactured by Zeon Corporation), to form an opening AP1. This resist pattern is called a resist pattern RP3A.

By using the resist pattern RP3A as an etching mask, the first insulating film 41 exposed in the first opening AP1 is removed by dry etching using etchant of $SF_6$ or $CF_4$.

By using the resist pattern RP3A and etched first insulating film 41 as a mask, the n-GaN cap layer 36 is wet etched using potassium hydroxide (KOH) aqueous solution. The n-GaN cap layer 36 is side etched to form a recess RC wider than the opening of the first insulating film 41. The first insulating film 41 protrudes in the eaves shape from the edges of the n-GaN cap layer 36 defining the recess.

Figure 5F:
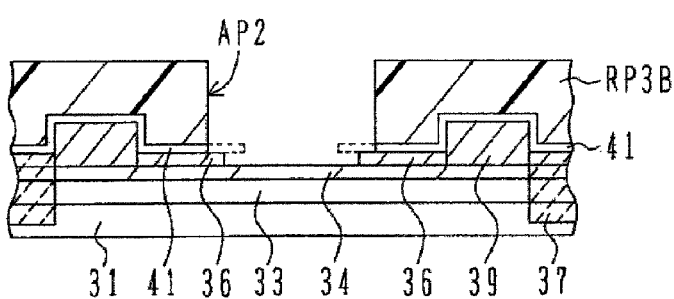

As shown in FIG. 5F, a low dose drawing region is developed by using high solubility developing liquid (e.g., ZEP-SD manufactured by Zeon Corporation), to form second openings AP2. This resist pattern is called a resist pattern RP3B. The eaves portion and the portion above the edge of the adjacent cap layer 36, respectively of the first insulating film 41, are therefore exposed.

By using the resist pattern RP3B as an etching mask, the first insulating film 41 exposed in the second opening AP2 is removed by dry etching using etchant of $SF_6$ or $CF_4$.

Figure 5G:
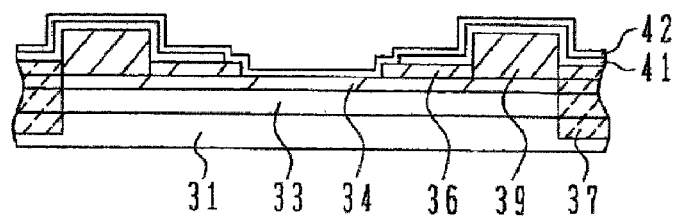

As show in FIG. 5G, a second insulating film 42 of a silicon nitride film having a thickness of, e.g., 20 nm is deposited on the whole substrate surface by plasma CVD. The semiconductor surface exposed in the recess is therefore covered with the second insulating film 42.

Figure 5H:
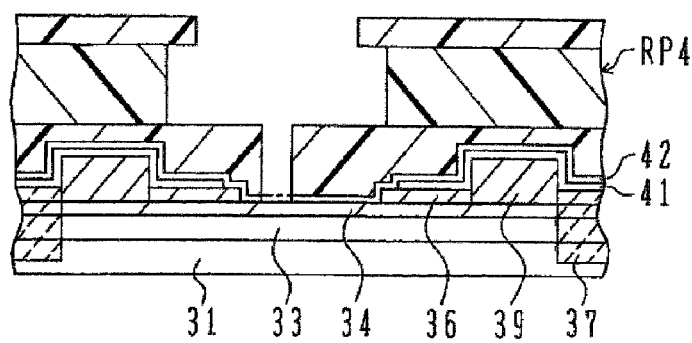

As shown in FIG. 5H, a three-layer EB resist pattern RP4 for forming the gate electrode is formed. Three resist layers are coated, an opening defining a widened portion of a T-shaped gate electrode is formed through the uppermost layer by EB exposure and development, a wider portion housing space for the T-shaped gate electrode is formed through the middle layer, and a leg portion opening of the T-shaped gate electrode for defining the gate length of the gate electrode is formed through the lowermost layer by EB exposure and development. The gate electrode opening is disposed in such a manner that a distance is set to, e.g., 30 nm between the surface (recess edge) of the second insulating film covering the side wall of the cap layer on the source side and the T-shaped gate electrode narrowed portion (leg portion).

By using the resist pattern RP4 as an etching mask, the second insulating film 42 exposed in the opening is removed by dry etching using $SF_2$ or $CF_4$ as etchant. If the insulating film 42 is not removed, a transistor having a MIS type gate electrode such as shown in FIG. 5K can be manufactured.

Figure 5I:
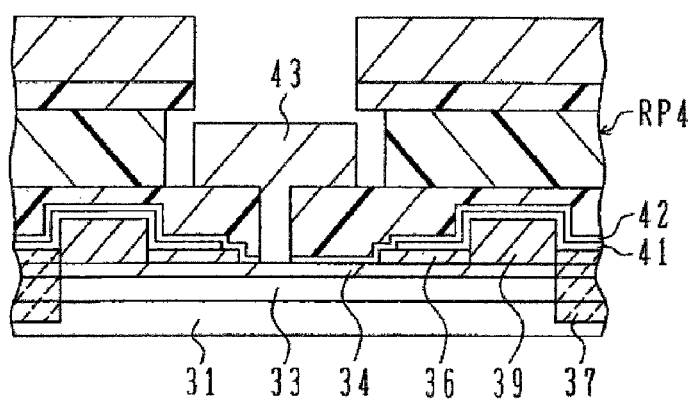

As shown in FIG. 5I, for example, an Ni layer of 10 nm thick and an Au layer of 300 nm thick are vapor-deposited downward on the substrate, to form a T-shaped gate electrode 43 by lift-off. The leg portion of the T-shaped gate electrode is formed near to the second insulating film 42 on the side wall of the cap layer on the source side at a distance of 30 nm. The upper wider portion lowers electric resistance of the gate electrode.

Figure 5J:
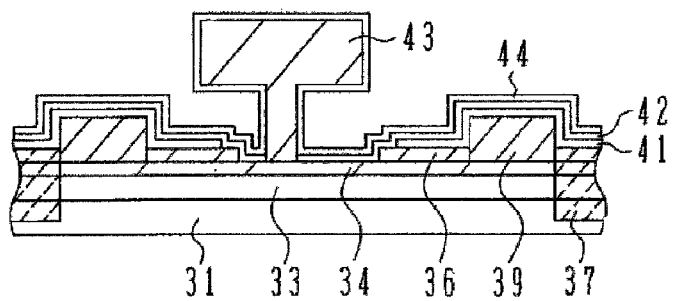
Figure 5K:
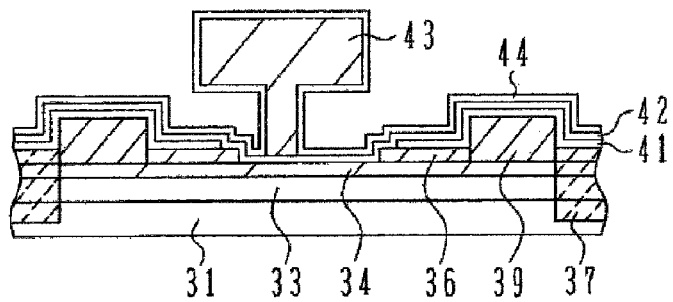

As shown in FIG. 5J, a third insulating film 44 of, e.g., a silicon nitride film as a protective film is deposited on the whole surface by plasma CVD, covering the gate electrode. The third insulating film may be applied also to the first embodiment as indicated by a broken line 24 shown in FIG. 1P.

The eaves portion may be extinguished by using a hard mask for wet etching. The degree of freedom of the layout of the gate electrode is improved and an offset layout of the gate electrode is also possible. By adjusting the layout of the insulating film, parasitic capacitance can be adjusted. The design satisfying high frequency characteristics and high breakdown voltage becomes easy. The modifications of the first embodiment are also applicable to the second embodiment. The present invention has been described in connection with the preferred embodiments. The invention is not limited only to the above embodiments. For example, HEMTs of other types can also be manufactured not limiting to HEMT using an InP substrate and GaN-HEMT using an SiC substrate. MISFHET may also be formed in place of HEMT. In this case, without forming the carrier supply layer, the cap layer is formed on a doped channel layer. It will be apparent to those skilled in the art that other various modifications, improvements, combinations, and the like can be made.

What is claimed is:

1. A method for manufacturing a compound semiconductor device comprising:
   (A) epitaxially growing layers including a channel layer and a resistance lowering cap layer in the order from a lower layer, above a compound semiconductor substrate by MOCVD;
   (B) forming source and drain electrodes in ohmic contact with said channel layer;
   (C) forming a first insulating film on said cap layer, said first insulating film covering said source and drain electrodes;
   (D) forming an electron beam resist layer on said first insulating film and performing electron beam exposure at different doses, at a high dose for a recess forming opening and at a low dose for an eaves portion removing opening;
   (E) developing said electron beam resist layer with low solubility developing liquid to form the recess forming opening, and etching said first insulating film;

(F) selectively wet-etching said cap layer by using as a mask said electron beam resist layer formed with said recess forming opening and said first insulating film, to form a recess wider than said recess forming opening and leave eaves portions of said first insulating film protruding over said recess;

(G) developing said electron beam resist layer with high solubility developing liquid to form the eaves portion removing opening, and etching said exposed first insulating film to extinguish the eaves portions of said first insulating film;

(H) forming a second insulating film on an exposed semiconductor surface, said second insulating film covering said first insulating film;

(I) forming a resist pattern having a gate electrode opening on said second insulating film; and (J) forming a gate electrode forming metal layer on said resist pattern to form a gate electrode by lift-off.

2. The method for manufacturing a compound semiconductor device according to claim 1, wherein said step (H) forms said second insulating film thinner than said first insulating film.

3. The method for manufacturing a compound semiconductor device according to claim 1, wherein said step (I) etches said second insulating film by using said resist pattern as an etching mask, to expose the semiconductor surface.

4. The method for manufacturing a compound semiconductor device according to claim 1, wherein said steps (C) and (H) form a silicon nitride film.

5. The method for manufacturing a compound semiconductor device according to claim 1, wherein said step (H) exposes the compound semiconductor substrate to $SiH_4$ or $Si_2H_6$ to form a silicon atomic layer.

6. The method for manufacturing a compound semiconductor device according to claim 1, wherein said step (A) grows a carrier supply layer between said channel layer and said cap layer, and the compound semiconductor device constitutes a high electron mobility transistor.

7. The method for manufacturing a compound semiconductor device according to claim 6, wherein said step (A) forms epitaxially grown layers including an InGaAs channel layer, an InAlAs carrier supply layer and an n-type InGaAs cap layer, on an InP substrate.

8. The method for manufacturing a compound semiconductor device according to claim 7, further comprising a step (K), between said steps (A) and (B), of etching said epitaxially grown layers in a mesa shape for forming an isolated region.

9. The method for manufacturing a compound semiconductor device according to claim 7, wherein said step (F) uses mixture liquid of phosphoric acid, hydrogen peroxide aqueous solution and water.

10. The method for manufacturing a compound semiconductor device according to claim 6, wherein said step (A) forms epitaxially grown layers including a GaN channel layer, an AlGaN carrier supply layer and an n-type GaN cap layer, on an SiC substrate.

* * * * *